United States Patent
Cox

(10) Patent No.: US 9,955,600 B2
(45) Date of Patent: Apr. 24, 2018

(54) FASTENERS FOR USE IN DISPLAY STRUCTURES

(71) Applicant: Watchfire Signs, LLC, Danville, IL (US)

(72) Inventor: Michael Cox, Danville, IL (US)

(73) Assignee: Watchfire Signs, LLC, Danville, IL (US)

( * ) Notice: Subject to any disclaimer, the term of this patent is extended or adjusted under 35 U.S.C. 154(b) by 224 days.

(21) Appl. No.: 14/731,682

(22) Filed: Jun. 5, 2015

(65) Prior Publication Data
US 2016/0242302 A1     Aug. 18, 2016

Related U.S. Application Data

(60) Provisional application No. 62/116,974, filed on Feb. 17, 2015.

(51) Int. Cl.
| | | |
|---|---|---|
| *F16B 21/00* | (2006.01) | |
| *H05K 5/02* | (2006.01) | |
| *F16B 2/14* | (2006.01) | |
| *F16B 2/06* | (2006.01) | |

(52) U.S. Cl.
CPC ............ *H05K 5/0221* (2013.01); *F16B 2/06* (2013.01); *F16B 2/14* (2013.01)

(58) Field of Classification Search
CPC .................................................. H05K 5/0221
USPC .......... 411/349; 292/87, 101, 102, 103, 202, 292/204, 242, 340, 114, 129
See application file for complete search history.

(56) References Cited

U.S. PATENT DOCUMENTS

| | | | |
|---|---|---|---|
| 472,892 A | 4/1892 | Knight | |
| 481,117 A | 8/1892 | Naegele | |
| 1,066,495 A | 7/1913 | Helvig et al. | |
| 1,071,999 A | 9/1913 | Gilson | |
| 1,595,402 A * | 8/1926 | Iler | E05C 19/10 |
| | | | 292/101 |
| 1,943,927 A * | 1/1934 | Phillips | E05B 83/243 |
| | | | 292/101 |
| 2,262,418 A | 11/1941 | Zahodiakin | |
| 2,373,722 A * | 4/1945 | Von Opel | F16B 5/10 |
| | | | 220/243 |
| 2,529,009 A | 11/1950 | Foss | |
| 2,549,793 A | 4/1951 | Francesco | |

(Continued)

FOREIGN PATENT DOCUMENTS

| | | |
|---|---|---|
| EP | 0118425 | 9/1984 |
| EP | 0175012 | 3/1986 |

(Continued)

*Primary Examiner* — Gary W Estremsky
(74) *Attorney, Agent, or Firm* — Dentons US LLP

(57) ABSTRACT

A fastener is disclosed for use in a display structure that includes a bracket defining a detent, a pin that is rotatably received by the bracket, and a latch, e.g., a helical spring, that is in engagement with the pin such that rotation of the pin causes corresponding rotation of the latch. The latch is configured, dimensioned, and positioned for engagement with the detent during movement of the fastener between first (unlocked) and second (locked) positions. During movement of the fastener between the first and second positions, the latch traverses the detent to provide a perceptible indication, e.g., an audible and/or tactile indication, that the fastener has been moved between the first and second positions.

15 Claims, 9 Drawing Sheets

(56) References Cited

U.S. PATENT DOCUMENTS

| | | | |
|---|---|---|---|
| 3,575,079 A | | 4/1971 | Smith |
| 3,966,163 A | | 6/1976 | Getzin |
| 4,050,724 A | | 9/1977 | Nakanishi |
| 4,136,898 A | | 1/1979 | Guenther |
| 4,319,420 A | | 3/1982 | Clinton |
| 4,465,328 A | * | 8/1984 | Tihanyi .................. E05C 3/042 292/60 |
| 6,816,389 B1 | | 11/2004 | Lutz et al. |
| 6,932,392 B1 | | 8/2005 | Geislhardt |
| 7,458,441 B2 | | 12/2008 | Hu |
| 8,201,206 B2 | | 6/2012 | Sofman et al. |
| 8,523,247 B2 | | 9/2013 | Talpe |
| 8,544,899 B2 | | 10/2013 | Hertrich |
| 8,864,183 B1 | | 10/2014 | Mason et al. |
| 2013/0183085 A1 | | 7/2013 | Zullig et al. |

FOREIGN PATENT DOCUMENTS

| | | |
|---|---|---|
| WO | WO 84/00926 | 3/1984 |
| WO | WO 2012/038376 | 3/2012 |

* cited by examiner

FASTENERS FOR USE IN DISPLAY STRUCTURES

CROSS-REFERENCE TO RELATED APPLICATIONS

This application claims the benefit of, and priority to, U.S. Provisional Patent Application Ser. No. 62/116,974, filed on Feb. 17, 2015, the entire content of which is hereby incorporated by reference.

BACKGROUND

1. Field

The present disclosure relates generally to display technologies and structures, and more particularly, to a fastener for use in securing modules, e.g., LED modules, to a module cabinet.

2. Discussion

During its lifespan, a display structure, such as a billboard, may require maintenance and/or modification. For example, it may be necessary, or desirable, to replace LEDs and circuitry, or to clean or otherwise maintain the internal components of the display structure. In such instances, access to the various internal components of the display structure typically requires the disengagement and re-engagement of a series of fasteners. Known fasteners, however, do not provide the technician with any indication that they have been properly engaged or disengaged, which can be problematic since the fasteners typically used in display structures are often only accessible from the front.

Accordingly, there remains a need for a fastener, and supporting structures, that provide the advantages of known fasteners, but overcome the limitations of the current technology.

SUMMARY

In one aspect of the present disclosure, a fastener is disclosed for use in a display structure. The fastener includes a bracket defining a detent, a pin that is rotatably received by the bracket, and a latch that is in engagement with the pin such that rotation of the pin causes corresponding rotation of the latch.

The latch is configured, dimensioned, and positioned for engagement with the detent during movement of the fastener between first and second positions, e.g., locked and unlocked positions. During movement between the first and second positions, the latch traverses the detent to provide a perceptible indication that the fastener has been moved between the first and second positions.

In certain embodiments, the latch and the detent may be configured and dimensioned to provide audible and/or tactile indications of movement between the first and second positions.

In certain embodiments, the pin may be rotatable within the bracket about an axis of rotation.

In certain embodiments, the pin may include a hole extending transversely in relation to the axis of rotation configured and dimensioned to receive a portion of the latch.

The latch includes a first end portion, an opposite second end portion, and an intermediate portion connecting the first and second end portions.

In certain embodiments, intermediate portion may be helical in configuration.

In certain embodiments, the hole in the pin may be configured and dimensioned to receive the first end portion of the latch.

In certain embodiments, the first end portion of the latch may be linear in configuration.

In certain embodiments, the pin may include rotation means that are configured and dimensioned to facilitate rotation of the pin in relation to the bracket. For example, the rotation means may include a head that is configured and dimensioned for engagement with a rotation tool.

In certain embodiments, the head may define a shoulder that is configured and dimensioned for engagement with the bracket.

In certain embodiments, the head may include structure facilitating engagement with the rotation tool selected from the group consisting of a slot, either linear or non-linear in configuration, a pair of intersecting slots, either linear or non-linear in configuration, and a polygonal recess, e.g., a hexagonal recess, a square-shaped recess, etc.

In certain embodiments, the pin may further include a shaft extending from the head and defining a transverse cross-sectional dimension less than that defined by the head. In such embodiments, the rotation means may further include structure formed in the shaft selected from the group consisting of: a slot, a pair of intersecting slots, and a polygonal recess.

In another aspect of the present disclosure, a display structure is disclosed that includes a cabinet having a module panel, and a plurality of modules that are releasably connectable to the module panel, each of which includes at least one fastener to releasably connect the module to the module panel.

Each of the fasteners includes a bracket defining a detent, a pin that is rotatably received by the bracket, and a latch that is in engagement with the pin such that rotation of the pin causes corresponding rotation of the latch.

The latch is configured, dimensioned, and positioned for engagement with the detent during movement of the fastener between an unlocked position, wherein the module is separable from the module panel, and a locked position, wherein the module is secured to the module panel.

During movement of the fastener between the locked and unlocked positions, the latch traverses the detent to provide a perceptible indication that the fastener has been moved between the locked and unlocked positions.

In certain embodiments, the latch may be helical in configuration such that during rotation of the latch, the latch captures and draws the module panel towards the module with which the fastener is associated.

In certain embodiments, each module may include an alignment pin, and the module panel may include a corresponding opening that is configured and dimensioned to receive the alignment pin.

In certain embodiments, the latch and the detent may be configured and dimensioned to provide audible and/or tactile indications of movement between the locked and unlocked positions.

Other objects, features, and advantages of the present disclosure will become apparent with reference to the drawings and the detailed description of the illustrative embodiments that follows.

DETAILED DESCRIPTION

In the following detailed description, reference is made to the accompanying drawings, which depict non-limiting, illustrative examples of various embodiments of the present disclosure. Other embodiments may be derived, and logical structural and mechanical changes may be made without departing from the scope of the present disclosure. To avoid unnecessary detail, the following description may omit certain information, items, or details known to those skilled in the art.

Throughout the present disclosure, the terms "front," "rear," "clockwise," and "counterclockwise" are used herein in a relative capacity, and are intended to be interpreted in accordance with the perspective shown in the corresponding figure(s).

The present disclosure relates to fasteners, supporting structures, and methodologies for connecting together the components of a display structure, and provides a number of benefits over those which are known in the art. For example, the fasteners, supporting structures, and methodologies described herein are not only inexpensive to manufacture, but simple to use, and provide feedback to the technician, e.g., tactile and/or audible feedback, indicating the position of the fasteners.

Figure 1:
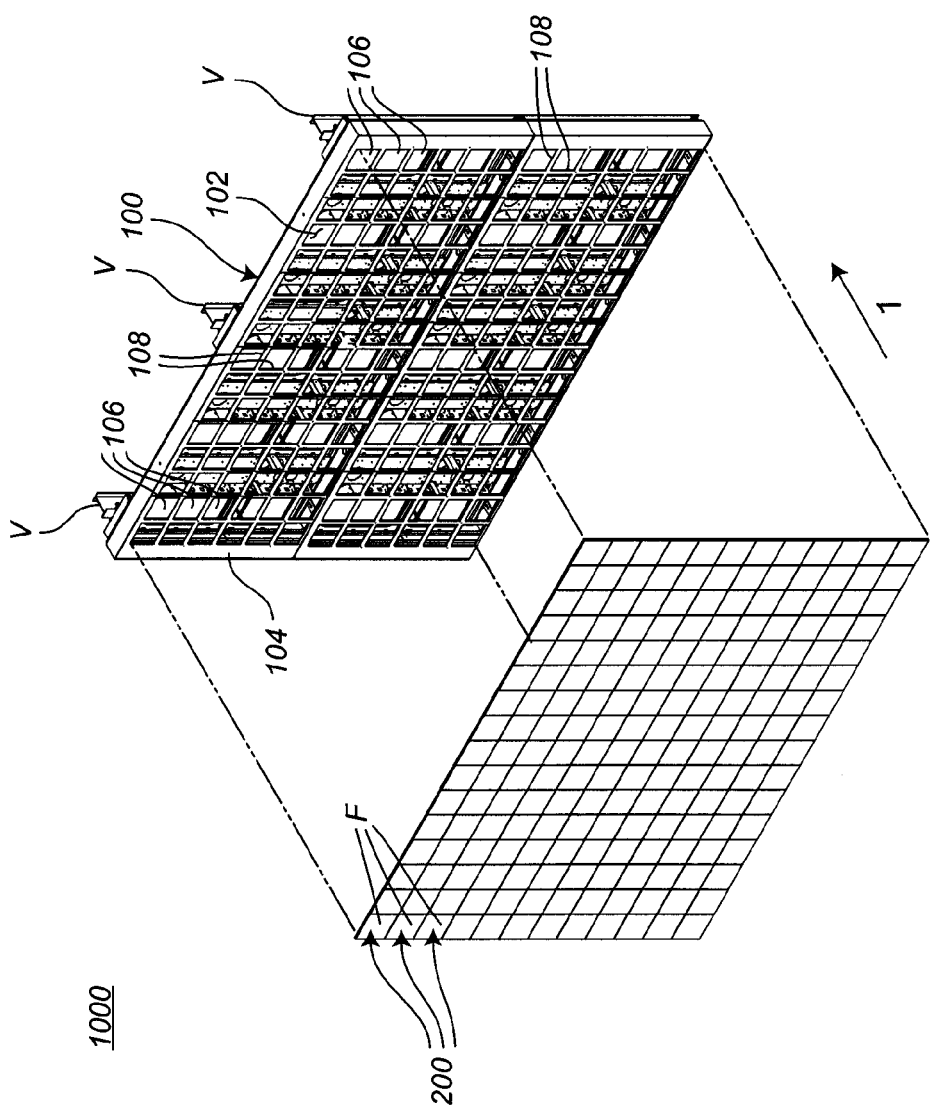
FIG. 1 is front, perspective view of a display structure according to the principles of the present disclosure including a cabinet and a plurality of modules.

With reference to FIG. 1, a display structure 1000 is disclosed that includes a cabinet 100, a plurality of modules 200 supported by the cabinet 100. In the embodiment of the disclosure illustrated in FIG. 1, the display structure 1000 is depicted as an LED (light emitting diode) billboard. It should be appreciated, however, that the principles of the present disclosure may find utility in various additional applications, e.g., electronic signs, displays, and the like.

The cabinet 100 is braced by one or more vertical supports V (FIG. 1), e.g., columns, braces, or the like, and defines one or more internal cavities 102 that house various additional components of the display structure 1000, e.g., electronics and circuitry, wiring, etc. (not shown). The cabinet 100 includes a module panel 104 that acts an interface between the cabinet 100 and the module(s) 200, and supports the modules 200. The cabinet 100, and the various components thereof, including the module panel 104, may be formed from any material suitable for the intended purpose of supporting the modules 200, e.g., metallic materials, plastics, polymers, or combinations thereof.

In the embodiment of the disclosure illustrated in FIG. 1, the cabinet 100 is illustrated as being generally rectangular in configuration. In alternate embodiments, however, the cabinet 100 may assume other geometrical configurations without departing from the scope of the present disclosure.

The module panel 104 includes a plurality of receptacles 106 that are defined by a series of horizontal and vertical struts 108, each of which is configured and dimensioned to accommodate a module 200. For example, the number of modules 200 supported by the cabinet 100 may be upwards of one thousand, or more.

In one embodiment of the disclosure, each module 200 includes a printed circuit board having a plurality of LEDs, arranged in a particular configuration, that are physically and electrically secured thereto such that the LEDs extend outwardly from a front surface F of the module 200 to create a display, e.g., an alphanumeric display or other graphic image. Although described in connection with LEDs through the present disclosure, the modules 200 may be utilized in connection with various technologies, e.g., liquid crystal displays (LCD), incandescent displays, etc.

With reference now to FIGS. 2A-7 as well, each module 200 includes one or more fasteners 300 that releasably connect the module 200 to the cabinet 100. For example, in the illustrated embodiment, each module 200 is depicted as including four (4) fasteners 300, one positioned in each corner of the module 200. In alternate embodiments, however, the number and/or position of the fasteners 300 may be varied without departing from the scope of the present disclosure.

The fasteners 300 are secured to rear surfaces R (FIGS. 2A, 2B, 3A) of the modules, i.e., the surfaces opposite the outwardly facing front surfaces F seen in FIG. 1, such that the fasteners 300 are housed within the internal cavity 102 (FIG. 1) of the cabinet 100. The fasteners 300 are thus accessed from the rear of the cabinet 100, e.g., during the replacement of LEDs and/or circuitry, cleaning of the cabinet 100, etc. In one embodiment, the fasteners 300 are secured to the modules 200 via one or more attachment members 308, e.g., screws, pins, rivets, or the like, as illustrated in FIG. 3A. Alternatively, the fasteners 300 may be secured to the modules 200 in an interference fit. For example, as illustrated in FIG. 3B, a portion of the fasteners 300 may be positioned between, and thus secured by, opposing portions of the module 200 with which they are associated, thereby potentially obviating the need for the aforementioned attachment members 308 (FIG. 3A).

The fasteners 300 releasably connect the modules 200 to the cabinet 100 via the module panel 104, and each include a bracket 302, a pin 304 that is received by the bracket 302, and a latch 306.

Each bracket 302 includes a first (front) mounting surface 310, a second (rear) mounting surface 312, and a bridge 314 that connects the mounting surfaces 310, 312. The first mounting surface 310 includes one or more through holes 316 that are configured and dimensioned to receive the attachment member(s) 308 (FIG. 3A) to facilitate connection of the bracket 302 to the rear surface R (FIGS. 2A, 2B, 3A) of the module 200, as well as a bore 318 that is configured and dimensioned to receive the pin 304.

The second mounting surface 312 includes a bore 320 in axial alignment with the bore 318 formed in the first mounting surface 310 that is also configured and dimensioned to receive the pin 304 such that, upon assembly of the fasteners 300, the pin 304 is received by each of the bores 318, 320. The bores 318, 320 are machined so as to permit rotation of the pin 304 within the bores 318, 320 about an axis of rotation X (FIGS. 4-7). The second mounting surface 312 further includes a detent 322 that extends outwardly therefrom in a direction away from the first mounting surface 310. The detent 322 is engageable with the latch 306, as described in further detail below, and may be configured and dimensioned in any manner suitable for this intended purpose. For example, the detent 322 may be arcuate, e.g., hemispherical or semi-conical in configuration, or the detent 322 may include linear portions, e.g., the detent 322 may be pyramidal, triangular, trapezoidal, etc. in configuration.

The pin 304 connects the bracket 302 and the latch 306, and includes a base 324, and a shaft 326 that extends from the base 324.

Figure 4:
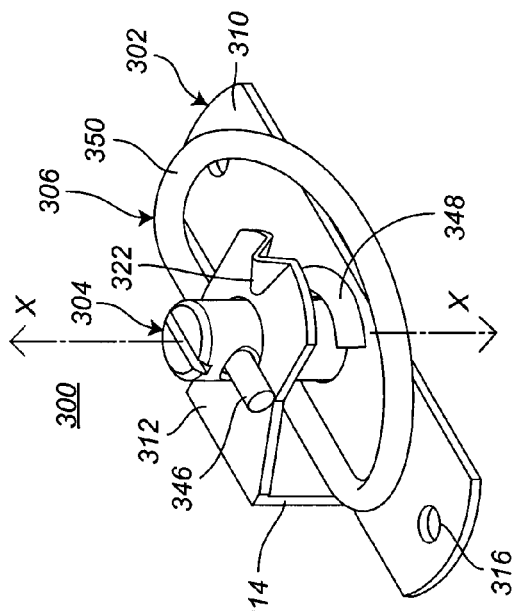
FIG. 4 is a top, perspective view of one embodiment of the fastener including a bracket, a pin, and a latch shown with parts separated.
Figure 5:
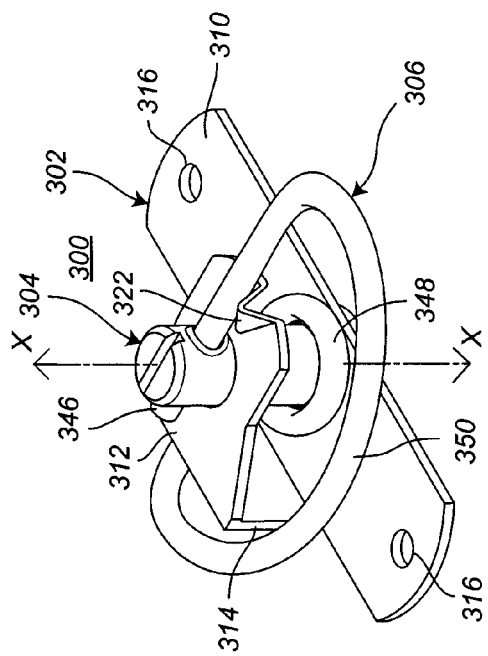
FIG. 5 is a top, perspective view of the fastener seen in FIG. 4 after assembly in the initial (unlocked) position.
Figure 8:
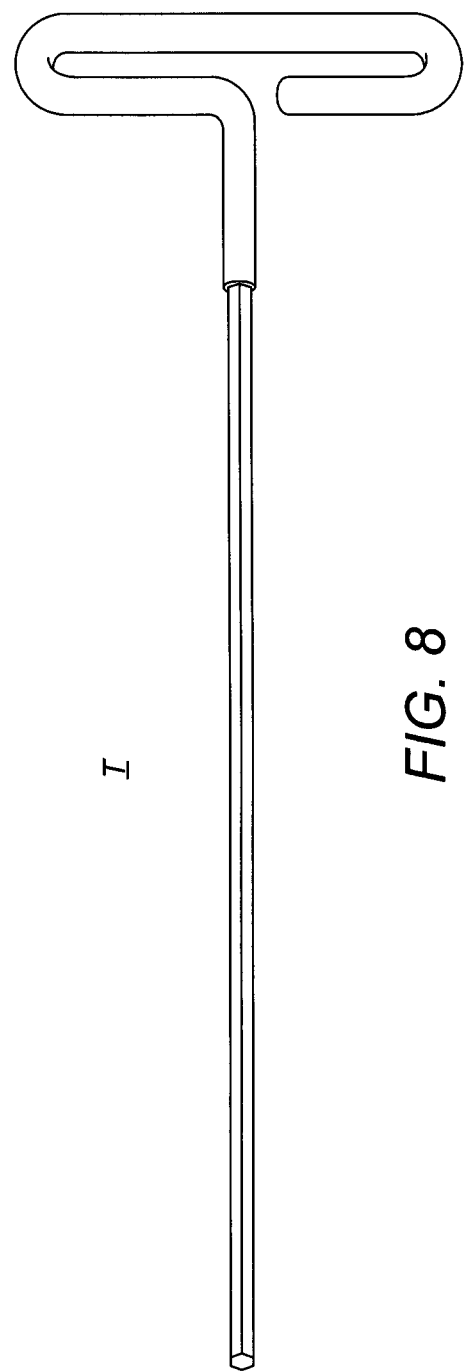
FIG. 8 is a side, plan view of a tool for use in moving the fasteners between the initial (unlocked) and subsequent (locked) positions.

The base 324 defines an outer transverse cross-sectional dimension, e.g., a diameter, D1 (FIG. 4) and the shaft 326 defines an outer transverse cross-sectional dimension, e.g., a diameter, D2 (FIG. 4). As seen in FIG. 4, for example, in certain embodiments, the outer transverse cross-sectional dimension D1 of the base 324 may be greater than the outer transverse cross-sectional dimension D2 of the shaft 326 such that the base 324 defines a shoulder 328 that is configured and dimensioned to engage a front side of the first (front) mounting surface 310 of the bracket 302. The base 324 further includes structure 330 (FIG. 7) that is configured and dimensioned for engagement with a rotation tool T (FIG. 8), such as an Allen wrench, screwdriver, etc. Specifically, in the embodiment illustrated in FIG. 7, the base 324 includes a recess 332 with a configuration corresponding to that defined by the tool T such that the tool T mates with the recess 332 to facilitate rotation of the pin 304 within the bores 318, 320 (FIG. 4) upon rotation of the tool T. In alternate embodiments, the configuration of the recess 332 in the base 324 may be varied without departing from the scope of the present disclosure.

The shaft 326 of the pin 304 defines a through bore 334 (FIG. 4) extending therethrough that is configured and dimensioned to receive a portion of the latch 306, as described in further detail below. The through bore 334 extends through the shaft 326 along an axis $X_{TB}$ that is transverse in relation to the axis of rotation X. For example, as illustrated in FIG. 4, the axis $X_{TB}$ may extend in orthogonal relation to the axis of rotation X, i.e., such that that axes X, $X_{TB}$ subtend an angle of 90°. In alternate embodiments, however, the axes X, $X_{TB}$ may subtend an angle less than 90° without departing from the scope of the present disclosure.

Figure 11:
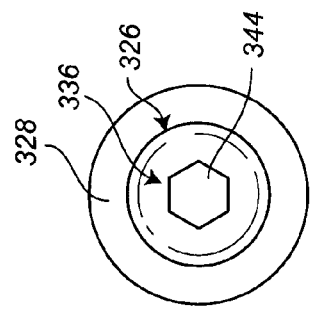
FIGS. 9-11 are top, plan views illustrating alternate embodiments of the pin in the fastener.
Figure 10:
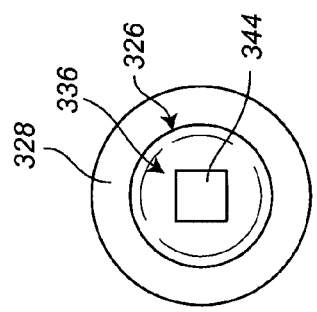
Figure 9:
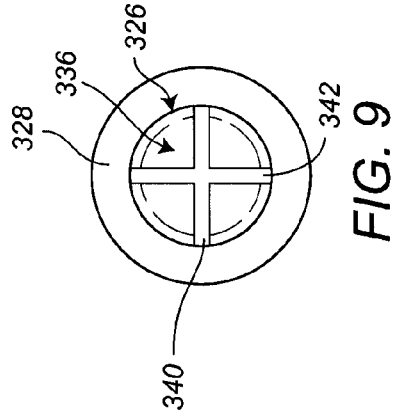
Figure 12:
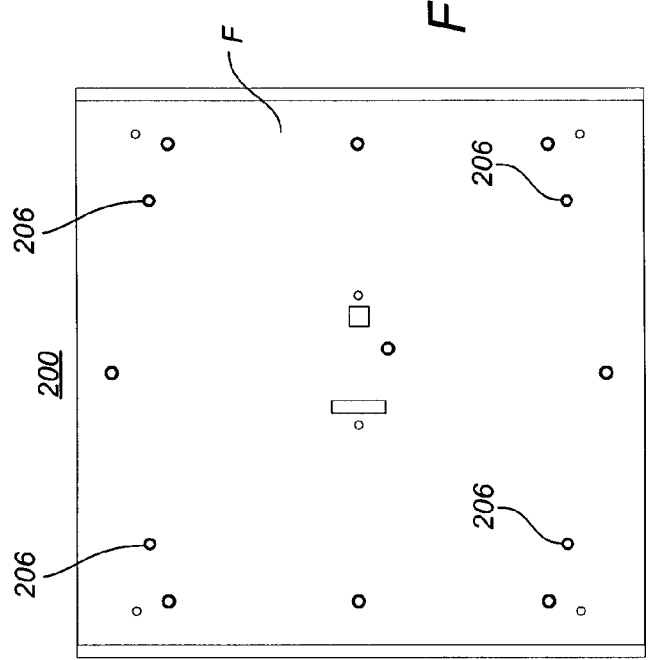
FIG. 12 is a front, elevational view of a single module.

The shaft 326 further includes structure 336 (FIG. 4) that is configured and dimensioned for engagement with a screwdriver, Allen wrench, or the like, e.g., the rotation tool T (FIG. 8), to further facilitate rotation of the pin 304 within the bores 318, 320 of the bracket 302. For example, as illustrated in FIG. 4, the shaft 326 may include a slot 338, which may be either linear or non-linear in configuration. Alternatively, the shaft 326 may include a pair of intersecting slots 340, 342 (FIG. 9), each of which may be either linear or non-linear in configuration, or a recess 344 that is polygonal in configuration, e.g., square-shaped (FIG. 10), hexagonal (FIG. 11), etc.

With continued reference to FIGS. 4-7, the latch 306 includes a first end portion 346, a second end portion 348, and an intermediate portion 350 that extends between the end portions 346, 348, and may be formed from any resiliently deformable material, e.g., steel, plastics, polymers, or combinations thereof. The first end portion 346 is configured and dimensioned for insertion into the through bore 334 (FIG. 4) extending through the shaft 326 of the pin 304, and may be either linear in configuration, as seen in FIG. 4-7, or arcuate. Due to the engagement between the shaft 326 of the pin 304 and the first end portion 346 of the latch 306, a rotational force applied to the pin 304 is transmitted to the latch 306, whereby the latch 306 rotates concomitantly with the pin 304.

The second end portion 348 of the latch 306 is also configured and dimensioned for engagement with the shaft 326 of the pin 304. For example, as illustrated in FIGS. 4-7, the second end portion 348 of the latch 306 may be arcuate in configuration so as to circumscribe the shaft 326 of the pin 304. Alternatively, it is envisioned that the second end portion 348 of the latch 306 may be configured and dimensioned for insertion into an additional through bore (not shown) formed in the shaft 326 of the pin 304 such that the second end portion 348 of the latch 306 engages the shaft 326 of the pin 304 in a manner similar to the first end portion 346 of the latch 306.

The intermediate portion of the latch 306 extends between the end portions 346, 348 of the latch 306, and is generally arcuate. For example, as seen in FIGS. 4-7, the latch 306 may assume the configuration of a generally helical spring such that rotation of the latch 306 via rotation of the pin 304 causes approximation of the latch 306 and the module panel 104 (FIGS. 2A, 2B), as described in further detail below.

The latch 306 may define a transverse cross-sectional dimension, e.g., a diameter, that is either constant along the length of the latch 306, as seen in FIG. 4-7, or variable. For example, the transverse cross-sectional dimensions defined at the end portions 346, 348 of the latch 306 may be enlarged to better withstand the rotational forces applied to the latch 306 during operation of the fasteners 300.

Figure 2A:
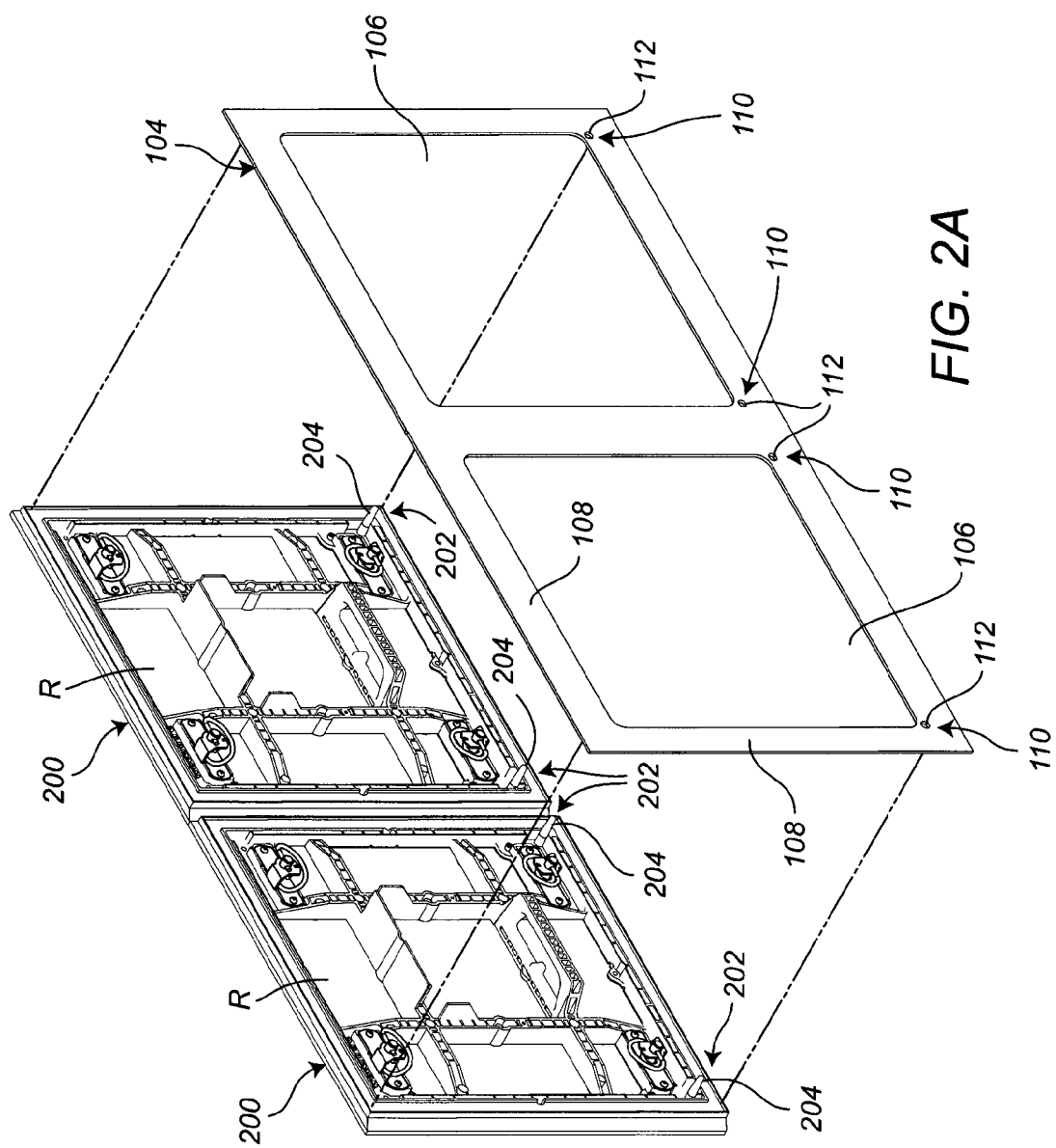
FIG. 2A is a partial, rear, perspective view of the display structure shown in FIG. 1 illustrating a pair of modules each including a plurality of fasteners shown in an initial (unlocked) position.
Figure 2B:
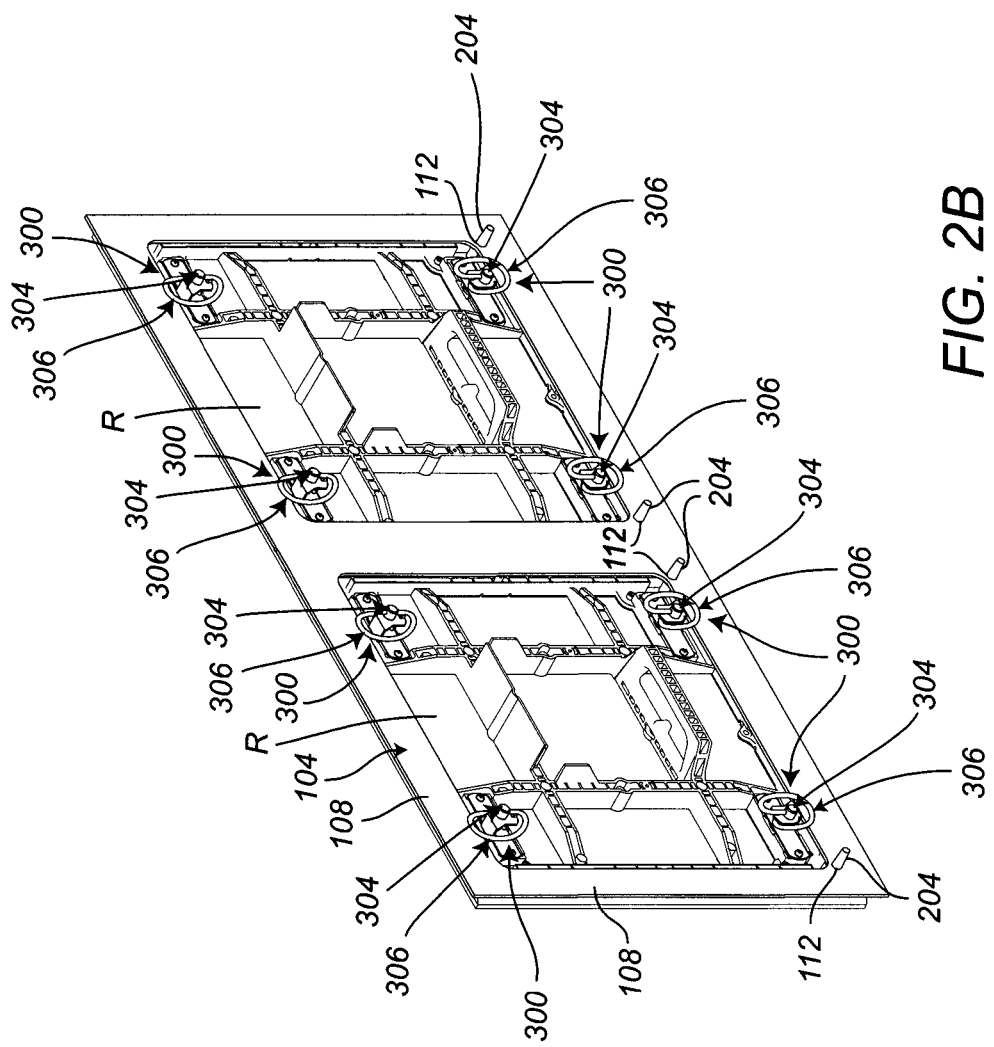
FIG. 2B is a partial, rear, perspective view of the display structure shown in FIG. 1 illustrating the pair of modules with the plurality of fasteners shown in a subsequent (locked) position.
Figure 3A:
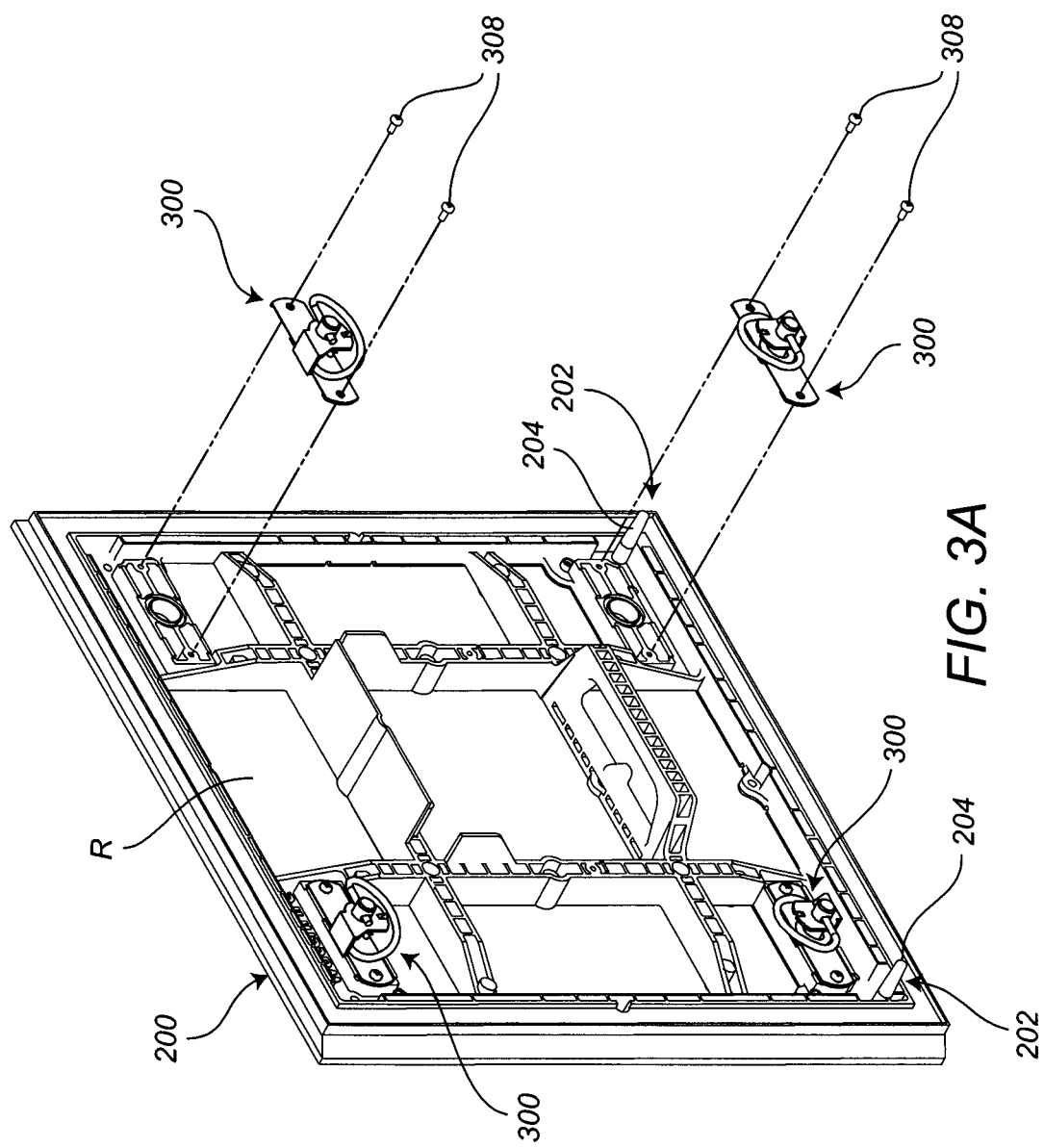
FIG. 3A is a rear, perspective view of a single module.
Figure 3B:
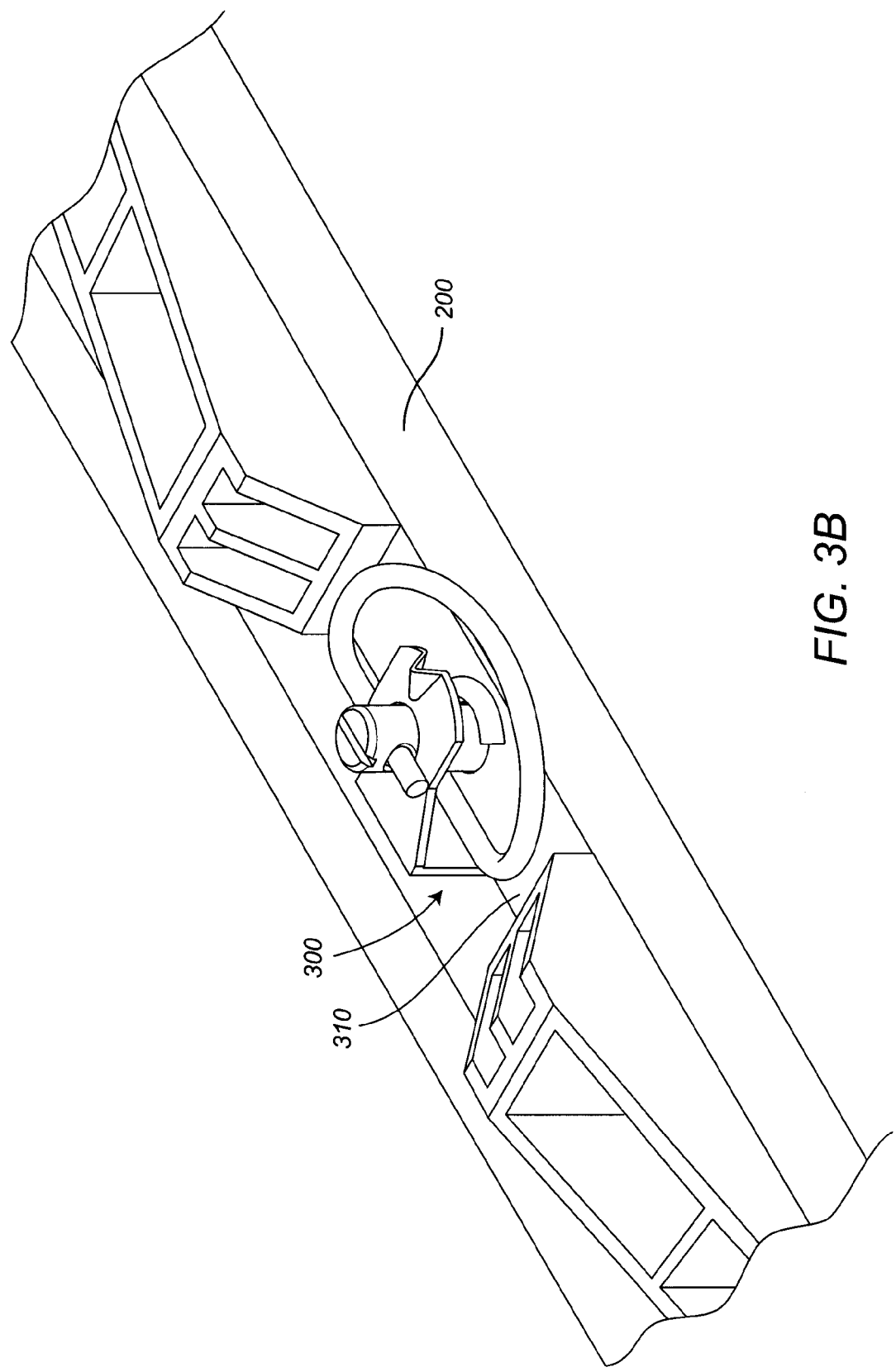
FIG. 3B is a partial rear, perspective view of a module according to an alternate embodiment of the present disclosure.

With reference now to FIGS. 1-8 and 12, use of the fasteners 300 will be discussed in connection with attachment of the modules 200 (FIGS. 1-3) to the module panel 104 (FIGS. 1, 2A, 2B). Initially, the modules 200 are inserted into the module panel 104 in the direction indicated by arrow 1 in FIG. 1. To facilitate proper alignment of the modules 200 and the module panel 104, it is envisioned that the modules 200 and the module panel 104 may include corresponding alignment structures 202, 110. For example, as illustrated in FIGS. 2A, 2B, and 3A, the modules 200 may include one or more alignment pins 204 that are configured and dimensioned for insertion into one or more corresponding apertures 112 formed in the module panel 104.

Figure 6:
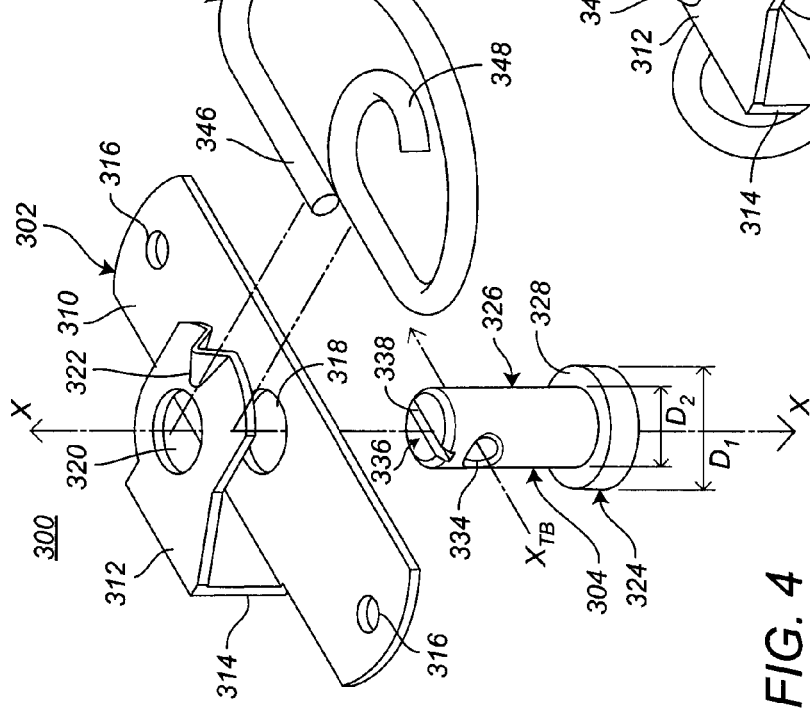
FIG. 6 is a top, perspective view of the fastener seen in FIG. 4 after assembly in the subsequent (locked) position.
Figure 7:
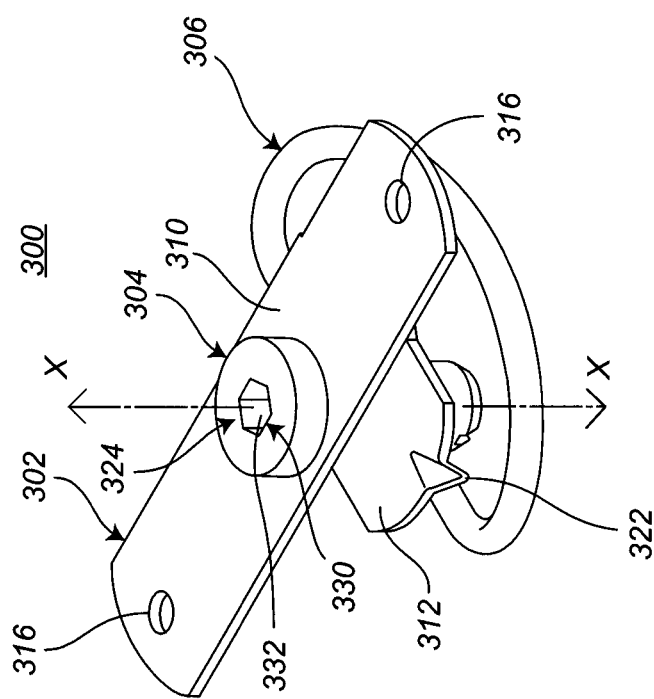
FIG. 7 is a bottom, perspective view of the fastener seen in FIG. 4 after assembly in the subsequent (locked) position.

After positioning of the module 200 in relation to the module panel 104, the tool T (FIG. 8) is inserted into openings 206 (FIG. 12) extending from the front surface F of the module 200 through to the rear surface R (FIGS. 2A, 2B, 3A) of the module 200 that are in communication/alignment with the structure 330 (FIG. 7) formed in the base 324 of the pin 304, e.g., the recess 332. The tool T is then rotated, i.e., clockwise in the illustrated embodiment, such that that fasteners 300 are moved from an initial (unlocked) position (FIGS. 2A, 5) to a subsequent (locked) position (FIGS. 2B, 6).

During movement from the initial (unlocked) position to the subsequent (locked) position, the latch 306 rotates concomitantly with the pin 304, whereby the latch 306 is caused to pass behind the module panel 104. As rotation of the latch 306 continues, due to the helical configuration of the latch 306, the distance between the latch 306 and the module panel 104 is decreased until the latch 306 ultimately engages the module panel 104. Thereafter, continued rotation of the latch 306 urges the module panel 104 inwardly, i.e., towards the module 200, and causes the latch 306 to engage the detent 322 (FIGS. 4-7) formed on the second mounting surface 312 of the bracket 302. Engagement of the latch 306 with the detent 322 inhibits continued rotation of the latch 306, providing the technician with a perceptible, tactile indication of the engagement. To continue rotation of the latch 306, the rotation force applied by the tool T (FIG. 8) is increased, whereby the latch 306 and the second (rear) mounting surface 312 of the bracket 302 are deflected resiliently outward in opposite directions, whereby inwardly directed biasing forces are created in the latch 306 and the second (rear) mounting surface 312. Deflection of the latch 306 and the second (rear) mounting surface 312 permits the latch 306 to complete traversal of, and pass, the detent 322.

As the latch 306 passes the detent 322, the biasing forces created in the latch 306 and the second (rear) mounting surface 312 return the latch 306 and the second (rear) mounting surface 312 to their normal, undeflected positions, and the force required to continue rotation of the latch 306 is reduced, providing the technician with not only a perceptible, tactile indication that the latch 306 has traversed the detent 322, but an audible indication as well in the form of a "click."

After traversal of the detent 322 by the latch 306, the latch 306 acts to resist unintended counterclockwise rotation (unlocking) of the latch 306 such that the module panel 104 remains locked and secured in place between the module panel 200 and the latch 306, as seen in FIG. 2B.

To disengage the fasteners 300 from the module panel 104, and thus permit removal of the module 200 from the cabinet 100, the fasteners 300 are moved from the subsequent (locked) position to the initial (unlocked) position by reversing the process. Specifically, the tool T (FIG. 8) is inserted into the structure 330 (FIG. 7) formed in the base 324 of the pin 304 through the openings 206 (FIG. 12) formed in the modules 200, and rotated, i.e., counterclockwise in the illustrated embodiment, such that that the latch 306 contacts and traverses the detent 322, again providing the technician with both tactile and audible indications as to the position of the latch 306. Continued rotation of the latch 306 causes disengagement of the latch 306 from the module panel 104 such that the module 200 may be withdrawn from the cabinet 100.

In addition to being manipulable from the front surface F (FIGS. 1, 12) of the modules 200 in the manner discussed above, the fasteners 300 are configured and dimensioned to permit manipulation from the rear surfaces R (FIGS. 2A, 2B, 3A) of the modules 200, e.g., in those instances where access to the front surface F is inhibited, cumbersome, or inconvenient. Specifically, the fasteners 300 can be moved between the initial (unlocked) position (FIGS. 2A, 5) and the subsequent (locked) position (FIGS. 2B, 6) through rotation of the pin 304 via the structure 336 (FIG. 4) formed in the shaft 326, rather than the structure 330 (FIG. 7) formed in the base 324 of the pin 304. For example, a screwdriver, Allen wrench, or other such tool can be positioned in engagement with the structure 336 and rotated to effectuate rotation of the latch 306 and operation of the fastener 300 in the manner discussed above.

While the present disclosure has been described in connection with specific, illustrative embodiments, it should be understood that the subject matter of the present disclosure is capable of further modifications. For example, persons skilled in the art will understand that additional components and features may be added to any of the embodiments discussed herein above, and that those elements and features described in connection with any one embodiment may also be applicable to, or combined with, those of any other embodiment without departing from the scope of the present disclosure.

The scope of the present disclosure is intended to cover any variations, uses, and/or adaptations of the presently disclosed subject matter in accordance with the principles of the present disclosure, including such departures that may be customary practice within the art to which the present disclosure pertains.

The invention claimed is:

1. A fastener for use in a display structure, the fastener comprising:
   a bracket including a first mounting surface, a second mounting surface, and a bridge, wherein the bridge connects the first mounting surface and the second mounting surface, wherein the first mounting surface opposes the second mounting surface, wherein the bridge and the second mounting surface define an L-shape, wherein the second mounting surface defining a detent projecting from the second mounting surface in a direction away from the first mounting surface;
   a pin having a longitudinal axis and rotatably received by the bracket such that the pin is rotatably mounted on the bracket and such that the longitudinal axis is perpendicular to the second mounting surface and such that the direction and the longitudinal axis are parallel; and
   a latch in engagement with the pin such that a rotation of the pin causes a corresponding rotation of the latch, wherein the latch is configured, dimensioned, and positioned for engagement with the detent during a movement of the latch between first and second positions, wherein the latch traversing the detent during the movement of the latch between the first and second positions to provide a perceptible indication that the latch has been moved between the first and second positions.

2. The fastener of claim 1, wherein the latch and the detent are configured and dimensioned to provide an audible indication of the movement of the latch between the first and second positions.

3. The fastener of claim 1, wherein the latch and the detent are configured and dimensioned to provide a tactile indication of the movement of the latch between the first and second positions.

4. The fastener of claim 1, wherein the pin is rotatable within the bracket about an axis of rotation, wherein the pin including a hole extending transversely in relation to the axis of rotation, wherein the hole is configured and dimensioned to receive a portion of the latch.

5. The fastener of claim 4, wherein the latch includes a first end portion, a second end portion, and an intermediate portion connecting the first and second end portions, wherein the intermediate portion is helical in configuration, wherein the first end portion is opposite the second end portion.

6. The fastener of claim 5, wherein the hole in the pin is configured and dimensioned to receive the first end portion of the latch.

7. The fastener of claim 6, wherein the first end portion of the latch is linear in configuration.

8. The fastener of claim 1, wherein the pin includes a rotation means configured and dimensioned to facilitate the rotation of the pin in relation to the bracket.

9. The fastener of claim 8, wherein the rotation means includes a head configured and dimensioned for engagement with a rotation tool.

10. The fastener of claim 9, wherein the head defines a shoulder configured and dimensioned for engagement with the bracket.

11. The fastener of claim 9, wherein the head includes a structure facilitating an engagement with the rotation tool, wherein the structure is selected from a group consisting of: a slot, a pair of intersecting slots, and a polygonal recess.

12. The fastener of claim 11, wherein the structure is the slot, wherein the slot is linear in configuration.

13. The fastener of claim 11, wherein the structure is the pair of intersecting slots, wherein the pair of intersecting slots are each linear in configuration.

14. The fastener of claim 11, wherein the pin further includes a shaft extending from the head, the shaft defining a transverse cross-sectional dimension less than that defined by the head.

15. The fastener of claim 14, wherein the structure is a first structure, wherein the rotation means includes a second structure formed in the shaft, wherein the second structure is selected from a group consisting of: a slot, a pair of intersecting slots, and a polygonal recess.

* * * * *